(12) United States Patent
Ryan (10) Patent No.: US 9,435,947 B2
(45) Date of Patent: Sep. 6, 2016

(54) INTEGRATION OF OPTICAL COMPONENTS IN INTEGRATED CIRCUITS BY SEPARATING TWO SUBSTRATES WITH AN INSULATION LAYER

(71) Applicant: GLOBALFOUNDRIES Inc., Grand Cayman (KY)

(72) Inventor: Errol T. Ryan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/850,381

(22) Filed: Sep. 10, 2015

(65) Prior Publication Data

US 2015/0378096 A1 Dec. 31, 2015

Related U.S. Application Data

(62) Division of application No. 13/925,916, filed on Jun. 25, 2013, now Pat. No. 9,209,075.

(51) Int. Cl.
| | |
|---|---|
| G02B 6/12 | (2006.01) |
| G02F 1/025 | (2006.01) |
| H01L 21/76 | (2006.01) |
| H01L 23/52 | (2006.01) |
| H01L 27/06 | (2006.01) |
| H01L 21/768 | (2006.01) |
| H01L 23/48 | (2006.01) |
| G02B 6/43 | (2006.01) |
| G02B 6/122 | (2006.01) |
| H01L 23/367 | (2006.01) |
| H01L 23/373 | (2006.01) |
| H01L 23/528 | (2006.01) |
| H01L 23/532 | (2006.01) |
| H01L 27/12 | (2006.01) |

(52) U.S. Cl.
CPC ............ *G02B 6/12004* (2013.01); *G02B 6/122* (2013.01); *G02B 6/43* (2013.01); *G02F 1/025* (2013.01); *H01L 21/76877* (2013.01); *H01L 23/367* (2013.01); *H01L 23/3731* (2013.01); *H01L 23/481* (2013.01); *H01L 23/528* (2013.01); *H01L 23/53228* (2013.01); *H01L 27/0694* (2013.01); *H01L 27/1203* (2013.01); *H01L 2924/0002* (2013.01)

(58) Field of Classification Search
CPC . G02B 6/43; H01L 21/76877; H01L 23/481; H01L 27/0694; H01L 2924/0042; G02F 1/025
USPC ........................................................ 385/14–24
See application file for complete search history.

(56) References Cited

U.S. PATENT DOCUMENTS

| | | | | |
|---|---|---|---|---|
| 7,236,060 | B2 * | 6/2007 | Wood | H03B 5/1852 327/291 |
| 9,209,075 | B2 * | 12/2015 | Ryan | H01L 21/76877 |
| 2006/0177173 | A1 * | 8/2006 | Shastri | G02B 6/42 385/14 |
| 2007/0064395 | A1 * | 3/2007 | Chen | H01L 21/4871 361/699 |
| 2007/0253663 | A1 | 11/2007 | Keyser et al. | |
| 2008/0017946 | A1 | 1/2008 | Cazaux et al. | |
| 2014/0270622 | A1 * | 9/2014 | Barwicz | G02B 6/126 385/11 |

\* cited by examiner

*Primary Examiner* — Akm Enayet Ullah
(74) *Attorney, Agent, or Firm* — Ditthavong & Steiner, P.C.

(57) ABSTRACT

Methodologies enabling integration of optical components in ICs and a resulting device are disclosed. Embodiments include: providing a first substrate layer of an IC separated from a second substrate level by an insulator layer; providing a transistor on the second substrate layer; and providing an optical component on the first substrate layer, the optical component being connected to the transistor.

20 Claims, 7 Drawing Sheets

INTEGRATION OF OPTICAL COMPONENTS IN INTEGRATED CIRCUITS BY SEPARATING TWO SUBSTRATES WITH AN INSULATION LAYER

CROSS-REFERENCE TO RELATED APPLICATION

This application is a Divisional of U.S. application Ser. No. 13/925,916, filed Jun. 25, 2013, the content of which is incorporated herein by reference in its entirety.

TECHNICAL FIELD

The present disclosure relates to manufacture of semiconductor devices. The present disclosure is particularly applicable for integrating optical components in integrated circuits (ICs) utilizing complementary metal-oxide-semiconductor (CMOS) technology.

BACKGROUND

In fabrication of semiconductor devices, traditional methods attempting to transfer chip bandwidth to other chips and server racks may integrate optical components on the chip (e.g., IC). Such optical components allow for optical interconnections between chips having power usage advantages over many metal interconnections. One traditional method integrating optical components requires a thin buried oxide (BOX) layer. However, optical components may benefit from or even require a thicker BOX layer in order to isolate light waveguides of the optical interconnections.

A need therefore exists for a methodology enabling integration of optical components in ICs, particularly, ICs utilizing CMOS technology, and a resulting device.

SUMMARY

An aspect of the present disclosure is a method of enabling integration of optical components in an IC by, inter alia, providing an insulator layer separating a first substrate layer having an optical component from a second substrate layer having a transistor connected to the optical component.

Another aspect of the present disclosure is a device having, inter alia, an insulator layer separating a first substrate layer having an optical component from a second substrate layer having a transistor connected to the optical component.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a first substrate layer of an IC separated from a second substrate level by an insulator layer; providing a transistor on the second substrate layer; and providing an optical component on the first substrate layer, the optical component being connected to the transistor.

Aspects include providing a heat transfer via (HTV) extending through the insulator layer, the HTV being adjacent to the second substrate layer. Some aspects include providing the HTV extending through the first substrate layer. Further aspects include providing the HTV vertically aligned with the transistor, wherein the first and second substrate layers and the insulator layer extend horizontally. Additional aspects include: providing the first substrate layer as a silicon on insulator (SOI) layer of a wafer for the IC; providing the insulator layer as a BOX layer of the wafer; providing the second substrate layer as a bulk silicon layer of the wafer; and providing the HTV of aluminum nitride (AlN). Some aspects include providing a through silicon via (TSV) through the insulator layer and the second substrate layer, the TSV connecting the transistor and optical component. Further aspects include providing the insulator layer with a thickness greater than a thickness of the first substrate layer. Additional aspects include providing the second substrate layer having a thickness greater than the thickness of the insulator layer. Some aspects include providing the first substrate layer with a thickness equal to a height of the optical component. Further aspects include: providing the first and second substrate layers and the insulator layer as a wafer; and rotating the wafer, wherein the transistor is provided prior to the rotation and the optical component is provided after the rotation or the optical component is provided prior to the rotation and the transistor is provided after the rotation.

Another aspect of the present disclosure is a device including: a first substrate layer of an IC, the first substrate layer including an optical component; an insulator layer on the first substrate layer; a second substrate layer separated, at least in part, from the first substrate layer by the insulator layer; and a transistor on the second substrate layer, the transistor being connected to the optical component.

Some aspects include a HTV extending through the insulator layer, the HTV being adjacent to the second substrate layer. Additional aspects include the HTV extending through the first substrate layer. Further aspects include the HTV being vertically aligned with the transistor, wherein the first and second substrate layers and the insulator layer extend horizontally. Some aspects include: the first substrate layer being a SOI layer of a wafer for the IC; the insulator layer being a BOX layer of the wafer; the second substrate layer being a bulk silicon layer of the wafer; and the HTV including AlN. Additional aspects include a TSV through the insulator layer and the second substrate layer, the TSV connecting the transistor and optical component. Further aspects include the insulator layer having a thickness greater than a thickness of the first substrate layer. Some aspects include the second substrate layer having a thickness greater than the thickness of the insulator layer. Additional aspects include the first substrate layer having a thickness equal to a height of the optical component.

Another aspect of the present disclosure is a method including: providing a wafer for an IC having: a bulk silicon layer extending in a horizontal direction; a BOX layer extending in the horizontal direction and having a thickness less than a thickness of the bulk silicon layer; and a SOI layer separated, at least in part, from the bulk silicon layer by the BOX layer, the SOI layer extending in the horizontal direction and having a thickness less than the thickness of the BOX layer; providing at least one transistor on the bulk silicon layer; rotating the wafer, after providing the at least one transistor; providing, after the rotation of the wafer, an optical component in the SOI layer; providing, after the rotation of the wafer, a TSV extending vertically through the bulk silicon layer and the BOX layer, the TSV connecting the at least one transistor and the optical component; and providing, after the rotation of the wafer, a HTV extending vertically through a horizontal portion of the BOX layer and the SOI layer, the HTV being adjacent to the bulk silicon layer and aligned vertically with the at least one transistor.

Some aspects include providing the SOI layer with a thickness equal to a height of the optical component.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of heat build up from transistors caused, for instance, by using a thicker BOX layer, which optical components may require, and/or insufficient isolation for light waveguides attendant upon using an SOI chip for integrating optical interconnects with CMOS technology. In accordance with embodiments of the present disclosure, the problems are solved, for instance by, inter alia, providing an insulator layer separating a bulk silicon layer with transistors from an SOI layer with optical components. Additionally, the provision of the insulation layer separating the bulk silicon layer with transistors from the SOI layer with optical components allows for a higher transistor density than traditional methods since the optical components are moved from the bulk silicon layer to the SOI layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
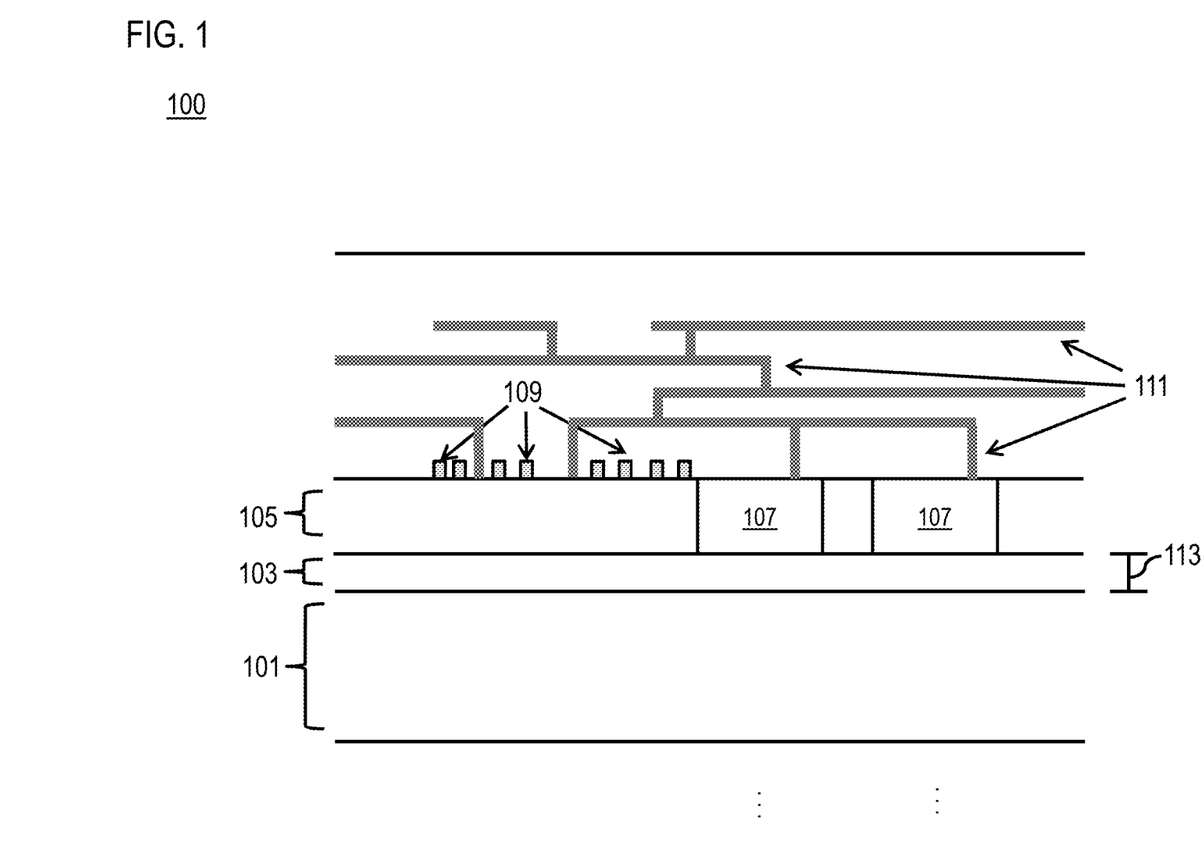
FIG. 1 illustrates optical components integrated in a CMOS.
Figure 2:
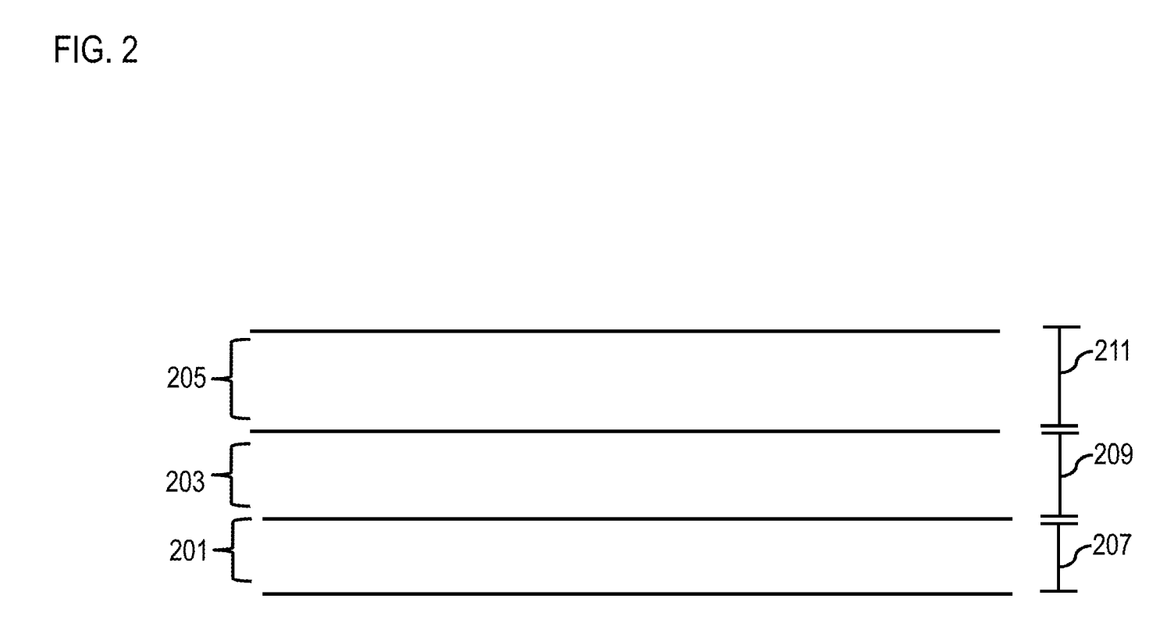
FIGS. 2 through 6 illustrate a method for providing a CMOS with integrated optical components, according to an exemplary embodiment.

FIG. 1 illustrates optical components integrated in a CMOS. FIG. 1 includes a chip 100 of an IC having a bulk silicon layer 101, a BOX layer 103, and a SOI layer 105 having optical components 107 (e.g., waveguides). As shown, transistors 109 and metal routes 111 are on top of SOI layer 105 and are separated by an inter-layer dielectric. Additionally, the BOX layer 103 is thermally insulating and isolates the optical components 107 based, at least in part, on a difference of index of refraction between the SOI layer 105 and the BOX layer 103. However, as discussed above, the width 113 of the BOX layer 103, in many instances, is too thin to isolate the optical components 107.

FIGS. 2 through 6 illustrate a method for providing a CMOS with integrated optical components, according to an exemplary embodiment. Adverting to FIG. 2, a SOI wafer is provided having SOI layer 201, BOX layer 203, and bulk silicon layer 205. As shown, the BOX layer 203 has a thickness 209, which is less than a thickness 211 of the bulk silicon layer 205 and greater than a thickness 207 of the SOI layer 201. The SOI wafer may be selected from a group of pre-fabricated SOI wafers based on the thickness 209 of the BOX layer 203, for instance, to allow optical components to isolate light waveguides.

Figure 3:
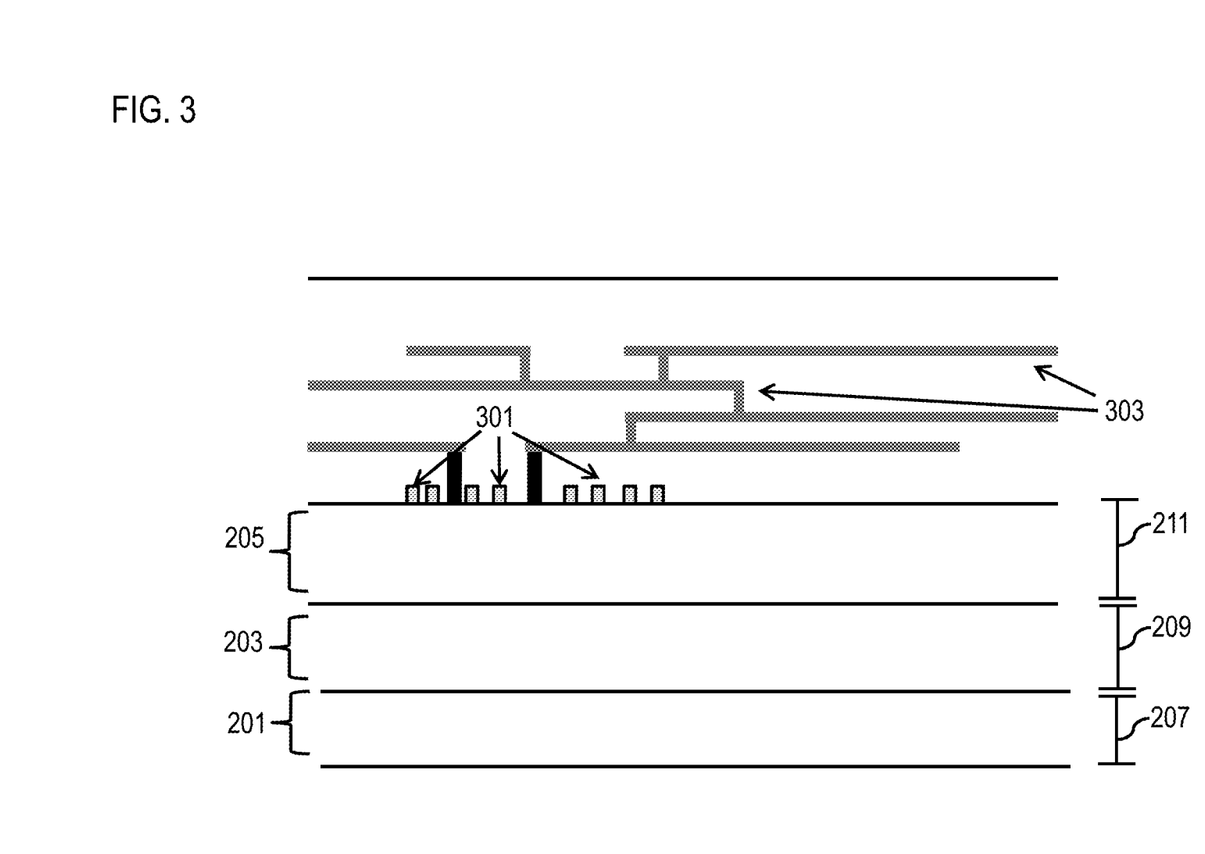
Figure 4:
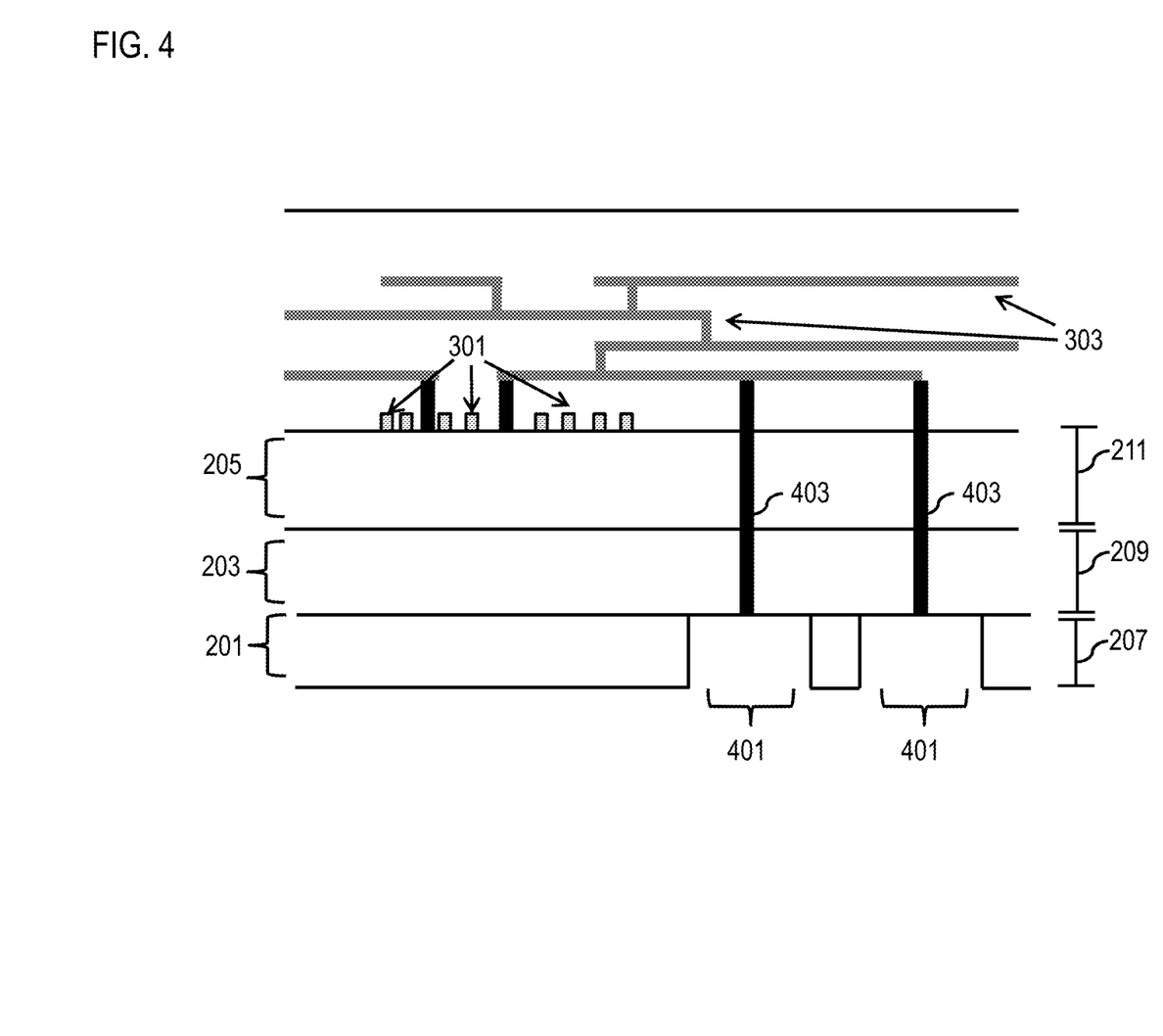

Adverting to FIG. 3, transistors 301 and metal routes 303 are provided on top of the bulk silicon layer 205 with an inter-layer dielectric separating the transistors 301 and metal routes 303. The transistors 301 may be formed using traditional methods and the metal routes 303 may be formed of copper (Cu) using traditional methods, for instance, Damascene processing. Next, as shown in FIG. 4, recesses 401 are formed in SOI layer 201 and TSVs 403 are formed in the recesses 401 and through the BOX layer 203 and the bulk silicon layer 205. Traditional methods may be used to form the recesses 401 and the TSVs 403, for instance, by, forming the transistors 301 and metal routes 303 and subsequently rotating (e.g., flipping) the resulting wafer and forming recesses 401 and TSVs 403 on the rotated wafer. Alternatively, the recesses 401 and TSVs 403 (and the subsequent steps illustrated in FIGS. 5 and 6) may be formed prior to the rotation of the wafer, and thereafter, the transistors 301 and metal routes 303 are formed.

Figure 5:
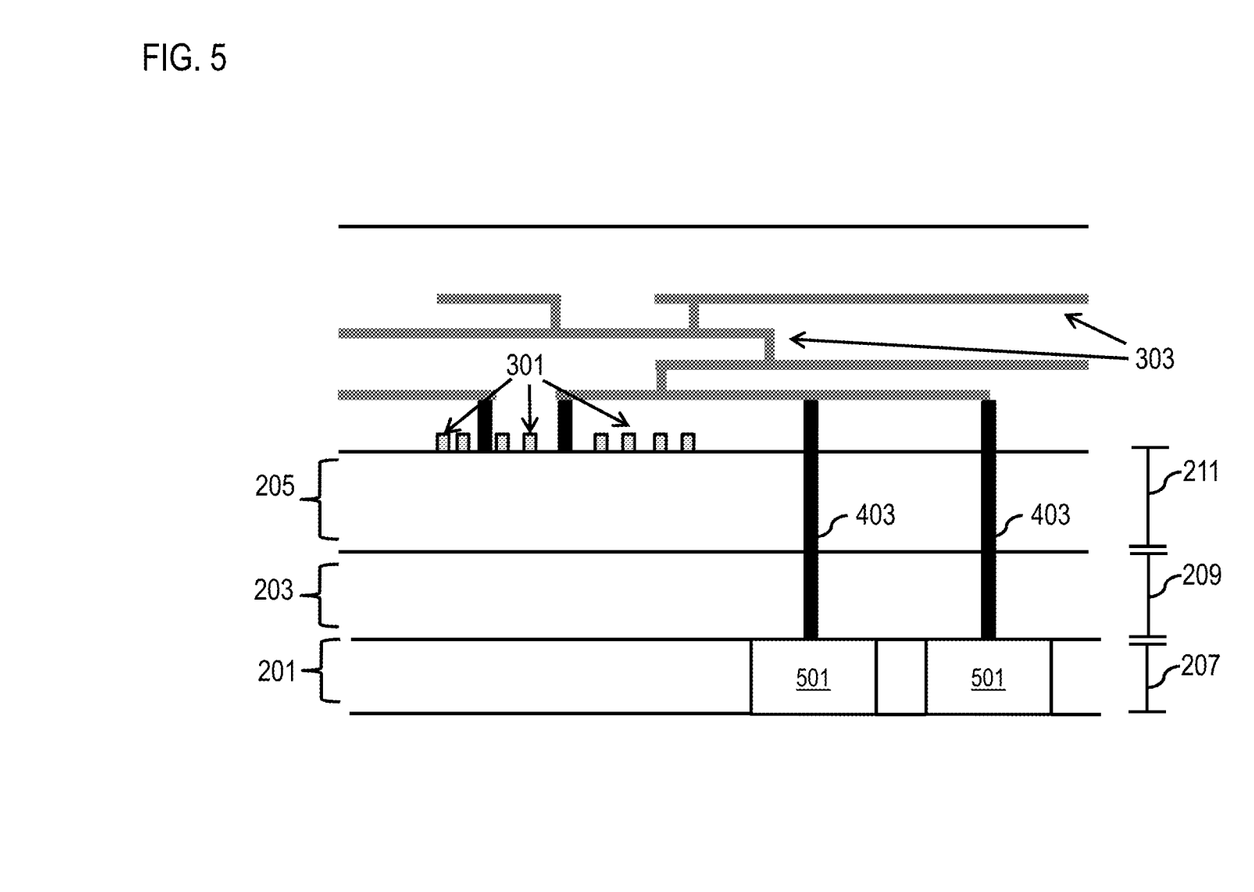
Figure 6:
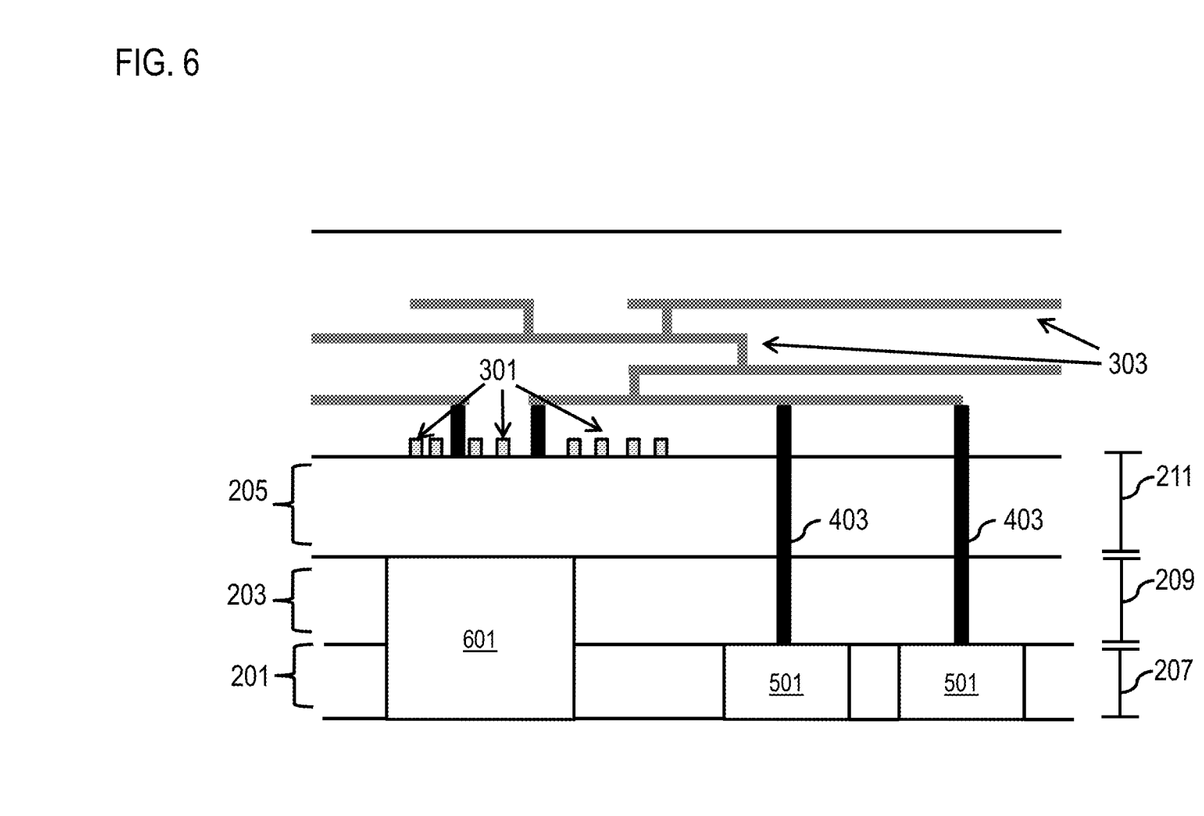

Adverting to FIG. 5, optical components 501 are provided in the recesses 401 of the SOI layer 201. As shown, the SOI layer 201 has a thickness 207 equal to a height of the optical components 501. Next, as illustrated in FIG. 6, a HTV 601 is provided adjacent to the bulk silicon layer 205. For instance, a recess (not shown) is formed in the SOI layer 201 and BOX layer 203, and the HTV 601 is formed in the recess. As shown, the HTV 601 is aluminum nitride (AlN) and vertically aligned with the transistors 301. It is contemplated that HTV 601 is vertical aligned with the transistors 301 when, for instance, HTV 601 is vertically aligned with at least a portion of one of the transistors 301.

Figure 7:
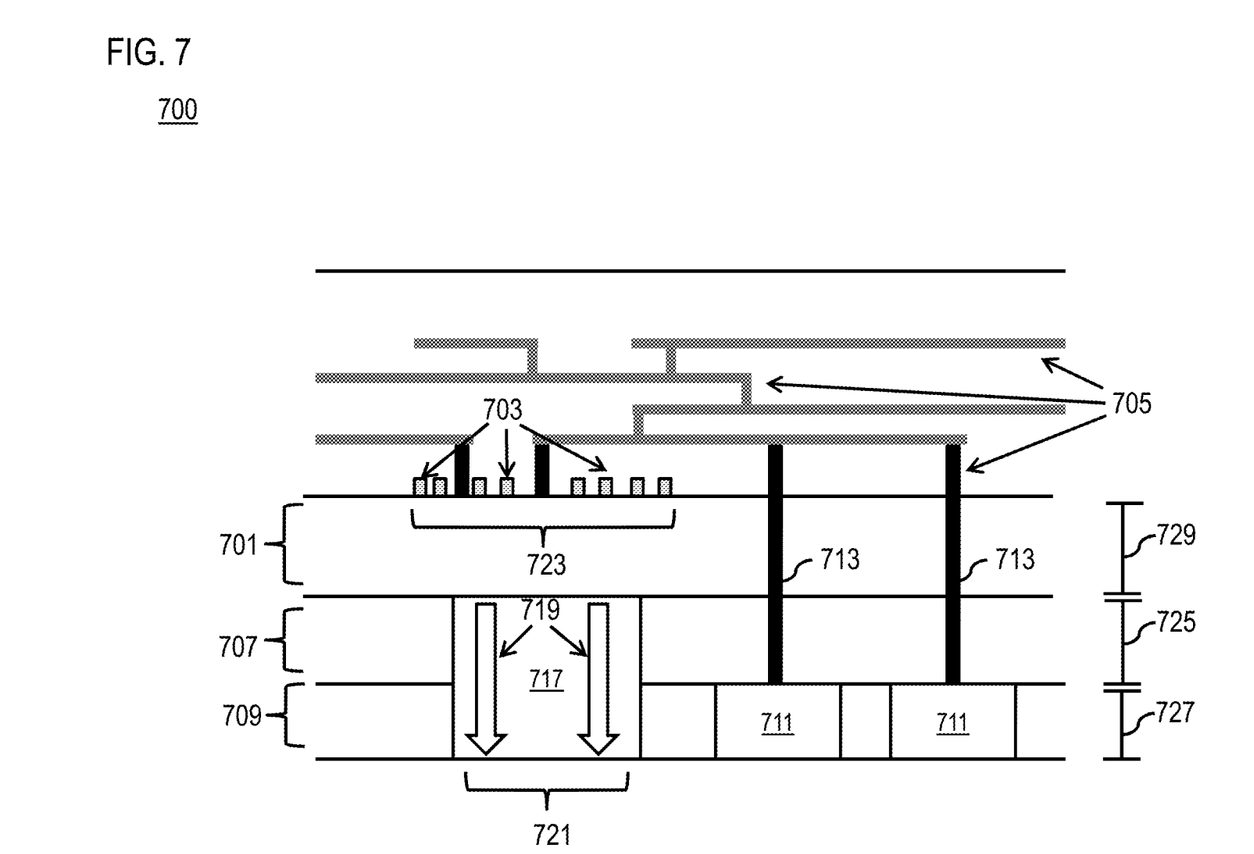
FIG. 7 illustrates a CMOS with integrated optical components, according to an exemplary embodiment.

FIG. 7 illustrates a CMOS with integrated optical components, according to an exemplary embodiment. As shown, the CMOS 700 is formed utilizing the steps illustrated in FIGS. 2 through 6 and includes a bulk silicon layer 701, transistors 703, metal routes 705, a BOX layer 707, and a SOI layer 709 having optical components 711. Additionally, TSVs 713 connect the transistors 703 to the optical components 711 through the bulk silicon layer 701 and the BOX layer 707. Further, HTV 717 is provided adjacent to the bulk silicon layer 701 and vertically aligned with midpoint of the transistors 703 to allow heat flow 719. The HTV 717 is composed of a metal or other material of high thermal conductivity such as, for instance, aluminum nitride (AlN) and has a width 721 extending to half a width 723 of the transistors 703. As previously mentioned, a thickness 725 of the BOX layer 707 may be selected to allow or improve an isolation of light waveguides by the optical components 711. The thickness 725 of the BOX layer 707 may be greater than a thickness 727 of the SOI layer 709 and less than a thickness 729 of the bulk silicon layer 701. As such, the thickness 725 of the BOX layer 707 is sized to allow the optical components 711 to isolate light waveguides and the HTV 717 is separately configured (e.g., width, position, material, etc.) to allow adequate heat flow 719 for the transistors 703.

The embodiments of the present disclosure can achieve several technical effects, including an integration of optical components into ICs, resulting in ICs having power usage advantages. The present disclosure enjoys industrial applicability in any of various types of highly integrated semiconductor devices, particularly ICs utilizing optical interconnects and CMOS technology.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. An apparatus comprising:
   a first substrate layer of an integrated circuit (IC), the first substrate layer including an optical component;
   an insulator layer on the first substrate layer;
   a second substrate layer separated, at least in part, from the first substrate layer by the insulator layer;
   a transistor on the second substrate layer, the transistor being connected to the optical component
   a waveguide on the first substrate layer, the waveguide being connected to the transistor; and
   a heat transfer via (HTV) extending vertically through a horizontal portion of the insulator layer and the first substrate layer, the HTV being adjacent to the second substrate layer and aligned vertically with the transistor,
   wherein the thickness of the insulator layer is greater than a thickness of the first substrate layer.

2. The apparatus according to claim 1, further comprising:
   the HTV being vertically aligned with the transistor, wherein the first and second substrate layers and the insulator layer extend horizontally.

3. The apparatus according to claim 1, further comprising:
   the first substrate layer being a silicon on insulator (SOI) layer of a wafer for the IC;
   the insulator layer being a buried oxide (BOX) layer of the wafer;
   the second substrate layer being a bulk silicon layer of the wafer; and
   the HTV comprising aluminum nitride (AlN).

4. The apparatus according to claim 1, comprising:
   a through silicon via (TSV) through the insulator layer and the second substrate layer, the TSV connecting the transistor and optical component.

5. The apparatus according to claim 1, further comprising:
   the second substrate layer having a thickness greater than the thickness of the insulator layer.

6. The apparatus according to claim 1, further comprising:
   the first substrate layer having a thickness equal to a height of the optical component.

7. An apparatus comprising:
   a wafer for an integrated circuit (IC) comprising:
     a bulk silicon layer extending in a horizontal direction;
     a buried oxide (BOX) layer extending in the horizontal direction and having a thickness less than a thickness of the bulk silicon layer; and
     a silicon on insulator (SOI) layer separated, at least in part, from the bulk silicon layer by the BOX layer, the SOI layer extending in the horizontal direction and having a thickness less than the thickness of the BOX layer;
   at least one transistor on the bulk silicon layer;
   an optical component in the SOI layer;
   a through silicon via (TSV) extending vertically through the bulk silicon layer and the BOX layer, the TSV connecting the at least one transistor and the optical component; and
   a heat transfer via (HTV) extending vertically through a horizontal portion of the BOX layer and the SOI layer, the HTV being adjacent to the bulk silicon layer and aligned vertically with the at least one transistor.

8. The apparatus according to claim 7, wherein the SOI layer has a thickness equal to a height of the optical component.

9. An apparatus comprising:
   a first substrate layer of an integrated circuit (IC) separated from a second substrate layer by an insulator layer;
   a transistor on the second substrate layer, the transistor being in direct contact with the second substrate layer;
   a waveguide on the first substrate layer, the waveguide being connected to the transistor; and
   a heat transfer via (HTV) extending vertically through a horizontal portion of the insulator layer and the first substrate layer, the HTV being adjacent to the second substrate layer and aligned vertically with the transistor,
   wherein the thickness of the insulator layer is greater than a thickness of the first substrate layer.

10. The apparatus according to claim 9, wherein
    the first substrate layer is a silicon on insulator (SOI) layer of a wafer for the IC;
    the insulator layer is a buried oxide (BOX) layer of the wafer;
    the second substrate layer is a bulk silicon layer of the wafer; and
    the HTV comprises aluminum nitride (AlN).

11. The apparatus according to claim 9, comprising:
    a through silicon via (TSV) through the insulator layer and the second substrate layer, the TSV connecting the transistor and waveguide.

12. The apparatus according to claim 9, wherein:
    the second substrate layer has a thickness greater than the thickness of the insulator layer; and
    the first substrate layer has a thickness equal to a height of the waveguide.

13. The apparatus according to claim 9, wherein:
    the first and second substrate layers and the insulator layer comprise a wafer; and
    the wafer is rotated, wherein the transistor is provided prior to rotating the wafer and the waveguide is provided after rotating the wafer or the waveguide is provided prior to rotating the wafer and the transistor is provided after the rotating the wafer.

14. The apparatus according to claim 10, further comprising:
   metal routes located on top of the bulk silicon layer.

15. The apparatus according to claim 14, further comprising:
   an inter-layer dielectric between the transistor and the metal routes.

16. The apparatus according to claim 14, wherein the metal routes comprise copper.

17. The apparatus according to claim 10, wherein the SOI layer comprises a plurality of recesses.

18. The apparatus according to claim 17, further comprising a through silicon via (TSV) in each of the recesses.

19. The apparatus according to claim 18, wherein each of the TSVs passes through the BOX layer.

20. The apparatus according to claim 19, wherein each of the TSVs passes through the bulk silicon layer.

* * * * *